(12) United States Patent
In et al.

(10) Patent No.: US 7,902,931 B1
(45) Date of Patent: Mar. 8, 2011

(54) WIDEBAND NON-LINEAR CIRCUITS FOR IMPLEMENTATION IN FREQUENCY CHANNEL SEPARATION

(75) Inventors: Visarath In, Chula Vista, CA (US); Patrick Longhini, San Diego, CA (US); Yong (Andy) An Kho, Chula Vista, CA (US); Joseph D. Neff, San Diego, CA (US); Adi R. Bulsara, San Diego, CA (US); Frank E. Gordon, San Diego, CA (US); Norman Liu, San Diego, CA (US); Suketu Naik, Kyoto (JP)

(73) Assignee: The United States of America as represened by the Secretary of the Navy, Washington, DC (US)

( * ) Notice: Subject to any disclaimer, the term of this patent is extended or adjusted under 35 U.S.C. 154(b) by 263 days.

(21) Appl. No.: 12/391,508

(22) Filed: Feb. 24, 2009

Related U.S. Application Data (63) Continuation-in-part of application No. 11/755,601, filed on May 30, 2007, now Pat. No. 7,714,671, which is a continuation-in-part of application No. 10/874,009, filed on Jun. 18, 2004, now Pat. No. 7,420,366.

(51) Int. Cl.
*H03B 1/00* (2006.01)
*H03L 7/24* (2006.01)
*H04J 1/00* (2006.01)
*H04J 1/02* (2006.01)

(52) U.S. Cl. .............. 331/55; 331/50; 331/75; 370/343; 370/497

(58) Field of Classification Search .................... 331/46, 331/50, 55, 57, 74, 75, 172; 370/343, 344, 370/480, 497; 455/150.1
See application file for complete search history.

(56) References Cited

U.S. PATENT DOCUMENTS

| | | | |
|---|---|---|---|
| 5,418,540 A * | 5/1995 | Thompson | .................... 342/379 |
| 5,528,445 A | 6/1996 | Cooke et al. | |
| 6,008,642 A | 12/1999 | Bulsara et al. | |
| 6,020,782 A | 2/2000 | Albert et al. | |
| 2007/0057186 A1 | 3/2007 | Nakasuji et al. | |

OTHER PUBLICATIONS

Visarath In et al, "Exploiting dynamical symmetry in coupled non-linear elements for efficient frequency down-conversion", Physical Review E 76, pp. 026201-1 to 026201-6 (2007).

(Continued)

*Primary Examiner* — David Mis
(74) *Attorney, Agent, or Firm* — Ryan J. Friedl; Kyle Eppele (57) ABSTRACT

A device includes a plurality of channel-capture circuits. Each circuit may include an array of N non-linear oscillators, wherein $N \geq 3$, circularly connected to each other in series such that unidirectional signal flow occurs between the oscillators. Each circuit may be configured to capture a respective channel signal from a wideband signal containing a plurality of channel signals and convert its captured channel signal to a lower frequency. Each oscillator may include an oscillator input configured to receive an output signal from another oscillator, an oscillator output configured to provide an output for an input of another oscillator, a frequency capture input configured to receive at least a portion of the wideband signal, at least two amplifiers, and a control capacitor coupled to the output of the amplifiers. An analog-to-digital converter may be coupled to the output of each channel-capture circuit.

14 Claims, 12 Drawing Sheets

OTHER PUBLICATIONS

Visarath In et al, "Complex dynamics in unidirectionally coupled overdamped bistable systems subject to a time-periodic external signal" Physical Review E 72, pp. 045104R-1 to 045104R-4 (2005).

Visarath In et al, "Complex behavior in driven unidirectionally coupled overdamped Duffing elements" Physical Review E 73, pp. 066121-1 to 066121-9 (2006).

Visarath In et al, "Coupling-induced oscillations in overdamped bistable systems", Physical Review E 68, pp. 045102R-1 to 045102R-4 (2003).

Visarath In et al, "Emergent oscillations in unidirectionally coupled overdamped bistable systems" Physical Review E 70, 036103-1 to 036103-12 (2004).

* cited by examiner

WIDEBAND NON-LINEAR CIRCUITS FOR IMPLEMENTATION IN FREQUENCY CHANNEL SEPARATION

CROSS REFERENCE TO RELATED APPLICATIONS

This application is a continuation-in-part of U.S. Non-provisional patent application Ser. No. 11/755,601, filed May 30, 2007, now U.S. Pat. No. 7,714,671 entitled "Wideband Non-Linear Channelizer for Rapid Processing of Static and Time-Varying Signals", which is a continuation-in-part of U.S. Non-provisional patent application Ser. No. 10/874,009, filed Jun. 18, 2004, now U.S. Pat. No. 7,420,366, entitled "Coupled Non-Linear Sensor System", the entire content of each being fully incorporated by reference herein.

FEDERALLY SPONSORED RESEARCH AND DEVELOPMENT

Wideband Non-linear Circuits for Implementation in Frequency Channel Separation is assigned to the United States Government and is available for licensing for commercial purposes. Licensing and technical inquiries may be directed to the Office of Research and Technical Applications, Space and Naval Warfare Systems Center, San Diego, Code 2112, San Diego, Calif., 92152; voice (619) 553-2778; email T2@spawar.navy.mil. Reference Navy Case No. 99373.

BACKGROUND

Using television signals, for example, a channel may carry both video and audio components of a broadcast occupying about six megahertz of the VHF frequency spectrum. For the purpose of this disclosure, a "channel" is defined as one or more related device components that respond over a particular frequency band. Further, a "channelizer" is a multi-channel device that may receive incoming signals, separate the incoming signals into a plurality of different channels based upon the frequency range of each individual channel, and provide the individual channels to some other device.

A traditional approach to creating a linear version of the channelizer is to directly digitize the signal using high-speed and highly accurate, i.e. having lots of bits, analog-to-digital converters (ADCs). The signal is then processed using dedicated digital signal processing hardware. Due to speed and accuracy limitations, many ADCs may be required to digitize 'chunks' of the spectrum in parallel. Although this approach is straight forward, and offers some significant benefits in performing specific functions (such as processing correlated spread spectrum signals that are below the ambient noise level), the resulting systems tend to be large, expensive, and power consuming. This makes them impractical for applications such as man-portable systems, which need to be compact, lightweight and power efficient.

While there is a strong effort within the engineering and scientific communities to develop high-speed, high-accuracy ADCs for such purposes, the low-power and low-cost devices needed to meet current signal processing needs remain elusive. Accordingly, new approaches to channelizing are desirable.

DETAILED DESCRIPTION OF SOME EMBODIMENTS

As used herein, a "channel" is defined as one or more related circuit components responding in a particular frequency band, while a "channelizer" (or "channelizing circuit" or other apparent derivatives) refers to a multi-channel device that may receive incoming signals, separate the incoming signals into a plurality of different channels based upon the frequency range of each individual channel, and provide the individual channels to some other device.

Some of the advantages of the disclosed methods and systems include the following:

An exemplary system may be configured as a parallel signal detector (many channels per microchip) of radio signal to discern the carrier frequency and the message it contains.

The lock on speed to an incoming signal is very rapid compared to an existing conventional system. The system may lock onto a signal on the order of 1 to 2 nanoseconds for an exemplary bi-stable circuit oscillating in the Giga-hertz range.

Target/incoming signals may be easily quantified via their effects on the frequency of the induced oscillations and in the intermixing of signals that produces the characteristic side bands in frequency space.

If a target/incoming frequency w is very high (such as in the GHz range), one may employ a large number N of non-linear oscillators in a capture circuit or channel (discussed below) so that the resultant array response is dynamically down-converted to frequency $\omega/N$ through a careful selection of operating parameters which confine the system to the appropriate regime in the phase space. Hence, many of the difficulties associated with the detection of very high frequency signals may be circumvented using this dynamical down-conversion property. It should be noted that even though the down converting properties exist, higher frequency oscillators to channel the higher frequencies are used. Simulations have shown that adding more oscillators to the array does not allow the channel to lock to higher frequencies unless the oscillators themselves have a higher natural frequency.

Non-linear bi-stable oscillators in a channelizer may automatically down-convert a target/incoming signal at its output when locked-on to the target/incoming signal. The down conversion effect depends on the number of oscillators used in configuring a channel. For example, if five oscillators are used, the signal at the output of each oscillator is down-converted to ⅕, i.e. $F_{in}/N$, where $F_{in}$ is the input signal frequency and N is the number of oscillator used in configuring a channel.

An active non-linear channelizing device may be very compact with numerous independent channel processing circuits built on a single microchip.

The channelizer may significantly reduce digital electronic components by eliminating components such as low-noise amplifiers (LNAs), mixers, local oscillators and IF filters.

The non-linear channelizer may significantly reduce size and cost of a given communication system.

Compact nature of the methods and systems allow for a parallel system to cover a wide spectrum of the signals.

A system may be configured to have different synchronization frequencies and frequency widths by changing the tuning parameters.

The benefits of using a non-linear 'oscillatory' system, by operating at or near a bifurcation, include high sensitivity for low-amplitude signals and 'signal compression' for large amplitude signals.

Only non-linear systems demonstrate synchronization, which in this case is used for both frequency and amplitude selectivity.

Figure 1:
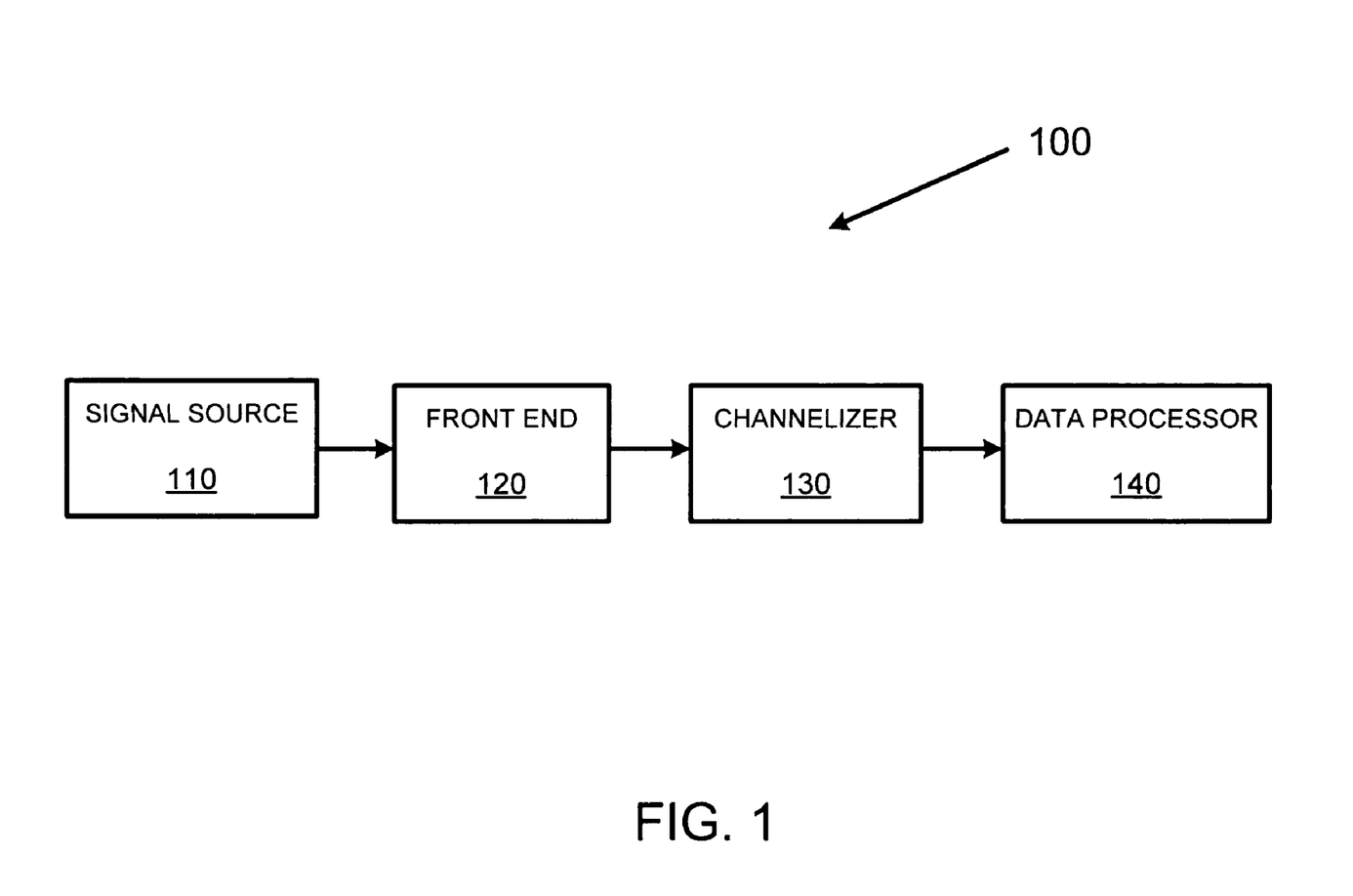
FIG. 1 shows an exemplary communication circuit employing a channelizer.

FIG. 1 shows an exemplary communication system 100. As shown in FIG. 1 the communication system 100 includes a signal source 110, a receiver front-end 120, a channelizer 130, and a data sink 140.

In operation, signal source 110 (which may in practice include a plurality of independent devices) may provide a wideband signal containing a plurality of independent channel signals. For example, signal source 110 may include several dozen television transmitters each transmitting a television signal over a different frequency band.

As the signal source 110 provides signals, the front-end 120 may receive the signals, (optionally) process the received signals (e.g., filtering, amplifying, etc. . . . ) and provide such signals to the channelizer 130. The channelizer 130, in turn, may separately process individual channels by capturing/locking on to individual channel signals and converting such captured signals to a lower frequency band. For example, the channelizer 130 may receive a first channel signal centered at 120 MHz and a second channel signal centered at 126 MHz, separate the first and second channel signals from each other and from any remaining channel signals, and down-convert the captured signals from 120 MHz/126 MHz to center frequencies of 40.0 MHz/42.0 MHz. The down-converted signals may then be digitized and provided to the data sink 140.

Figure 2:
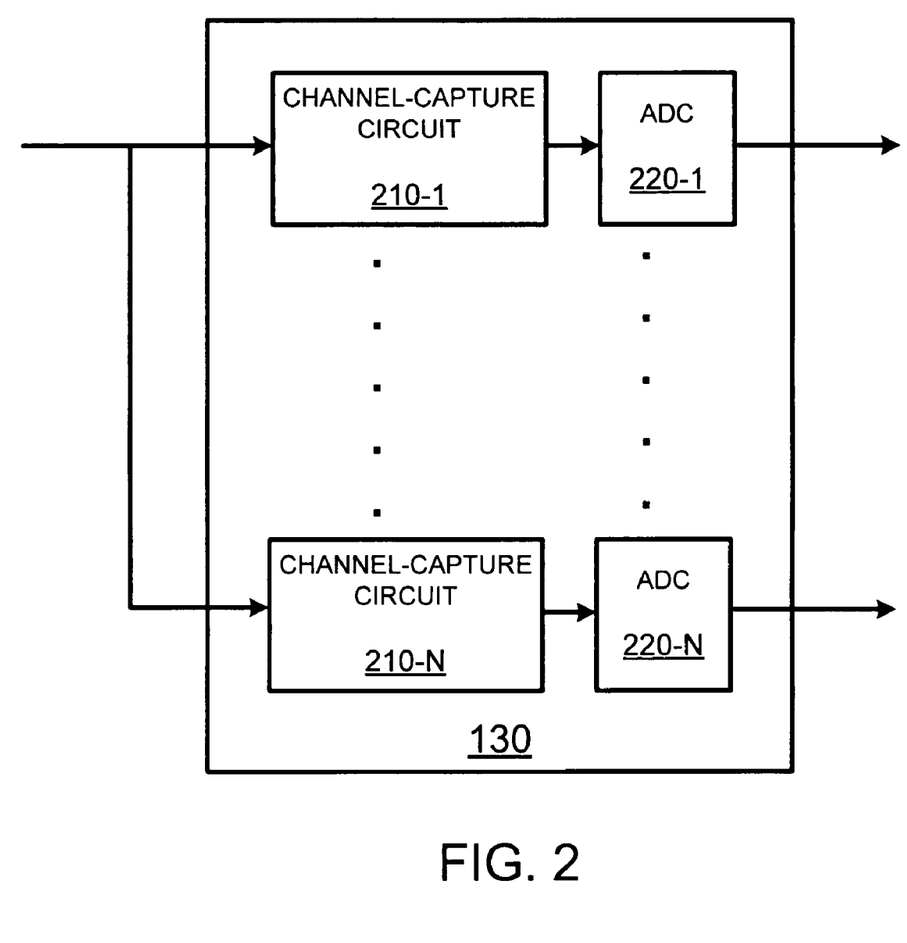
FIG. 2 shows the exemplary channelizer for the communication circuit of FIG. 1.

FIG. 2 shows the exemplary channelizer 130 for the communication circuit of FIG. 1. Channelizer 130 includes a plurality of channel-capture circuits 210-1 . . . 210-N each coupled to a respective analog-to-digital converter (ADC) 220-1 . . . 220-N. In operation, a received signal, such as a wideband signal containing various television and radio signals, may be fed to the various channel-capture circuits 210-1 . . . 210-N, whereby the individual channel-capture circuits 210-1 . . . 210-N may capture individual channel signals contained within the wideband signal, and down-convert the individual signals to a lower frequency. Following the down-conversion, ADCs 220-1 . . . 220-N may digitize the respective down-converted signals and provide the digitized signals to any number of other devices.

Figure 3:
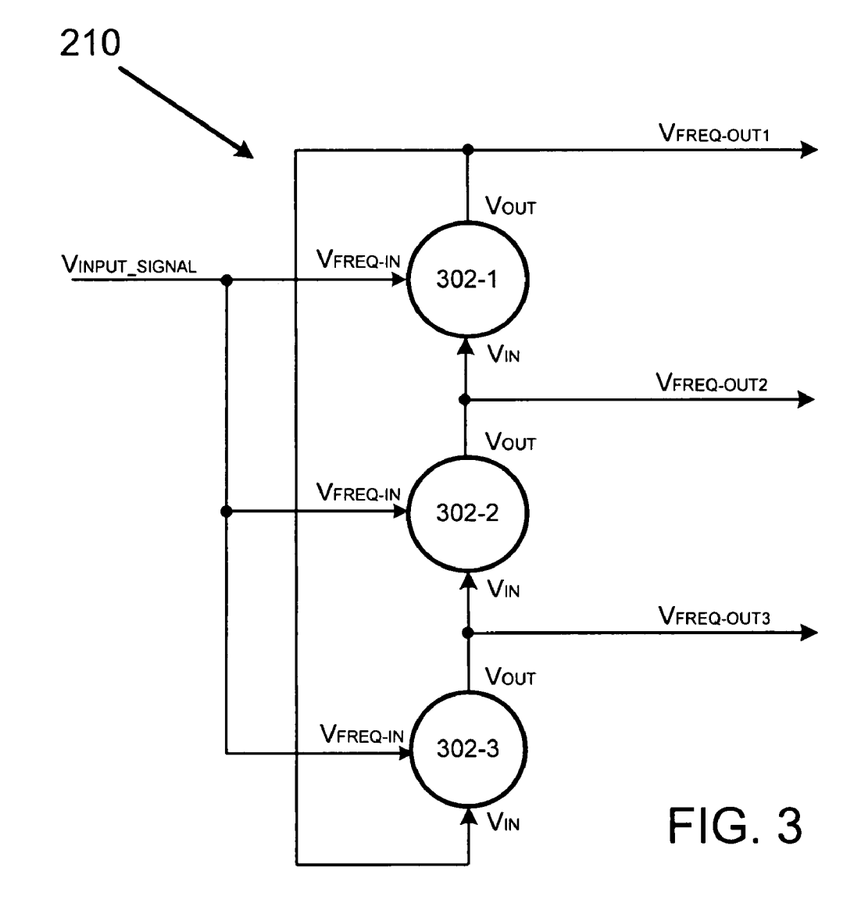
FIG. 3 shows an exemplary channel capture circuit.

FIG. 3 shows an exemplary channel-capture circuit 210 having an array of three non-linear oscillators 302-1, 302-2 and 303-3 each having a respective output signal $V_{FREQ\text{-}OUT1}$, $V_{FREQ\text{-}OUT2}$ and $V_{FREQ\text{-}OUT3}$. In some embodiments, oscillators 302-1, 302-2, and 302-3 may be non-linear, bi-stable, over-damped oscillators. As shown in FIG. 3, oscillators 302-1, 302-2 and 303-3 are circularly coupled to each other in series such that unidirectional signal flow occurs between the oscillators. This configuration may entail having oscillators 302-1, 302-2 and 303-3 unidirectionally-coupled in series such that the output of each oscillator in the array is coupled to an input of another oscillator in the array. As shown, the output of oscillator 302-3 is coupled to an input of oscillator 302-2, the output of oscillator 302-2 is coupled to an input of oscillator 302-1, and the output of oscillator 302-1 is coupled to an input of oscillator 302-3. Such a coupling of oscillators 302-1, 302-2 and 303-3 may be referred to as a "ring" configuration. While the exemplary channel-capture circuit 210 is depicted as having only three oscillators, it should be appreciated that a given channel-capture circuit might include an array of N non-linear oscillators, noting that the number of oscillators may affect frequency down-conversion.

In some embodiments, channel capture circuits 210 may include a plurality of unidirectionally coupled non-linear oscillators consisting of odd (N≧3) and even (N≧6) oscillators. As the frequency and other dynamical characteristics of the emergent oscillations may depend on the system and target signal characteristics, it should be appreciated that a system may be configured to detect and/or quantify very weak DC and time-dependent periodic (AC) target signals to suit a particular application.

While it is known that over-damped and unforced dynamical systems do not oscillate, well-designed coupling schemes, together with the appropriate choice of initial conditions, may induce oscillations when a certain system control parameter exceeds a threshold value. For example, using a specific (uni-directional, with cyclic boundary conditions) coupling scheme, together with non-identical initial conditions, a coupled system of N oscillators may oscillate when the coupling coefficient is swept through a critical value which is known by the system users.

The ensuing oscillations have found utility in the detection of very weak time invariant (DC) target signals, via their effect on the oscillation characteristics. Time-dependent (AC) target signals may also be detected through a variety of cooperative oscillatory phenomena that occur when they interact with the internal coupled system dynamics. The embodiments described herein may be applied to magnetic sensor systems that operate at comparatively low frequency (a few Hz, vice GHz for RF signals). The embodiments described herein may also be applied to the detection of non-magnetic target signals, so long as the underlying detection oscillators (the coupled oscillator array) are suitably chosen and constructed.

While, in principle, one may choose the nature of the non-linearity in many ways, some embodiments described herein relate to a specific choice of non-linearity and its own particular dynamics that permit the detection and processing of input electromagnetic radiation signals over a large frequency range (MHz to GHz). This may entail exploiting the unique non-linear dynamics of a coupled array, the constituent of the system, and specific construction to meet a specific application requirement which is discussed below. Incorporating a different functional form of the non-linearity may lead to qualitatively similar behavior. The choice of non-linear transfer characteristic may be quite general.

The circuits discussed herein may be used to synchronize, or lock on to, a specific band of frequencies. It is to be appreciated that the pertinent channelizing qualities are not restricted to over-damped non-linear oscillators. For example, a single non-linear (self oscillating or not) oscillator of any internal dimension may be used to detect a single channel (but with no frequency down conversion).

Additionally, such circuits may have a useful quality that allows them to operate in a quiescent state. For example, in the presence of an appropriate radio frequency (RF) signal, a prospective non-linear circuit may undergo a dynamical change known as a bifurcation, resulting in oscillatory behavior that is phase and frequency locked to a received carrier signal. Because such prospective circuits may be designed to contain a very small number of parts and be compact, many channels may be constructed on a single chip, e.g. ten channels on 5 mm×5 mm die.

Still further, such circuits may be constructed in such a way that each oscillator array composed of three or more non-linear oscillators respond to a unique narrow band of frequencies, thereby "channelizing" a broad spectrum of signals across all the channels simultaneously. In addition, the output of the corresponding array may be digitized and processed to extract information or messages and, in some cases, may be re-radiated to provide additional functionality as a signal repeater or as a jamming signal. For a jamming application, alteration of the signal would have to occur in order to not transmit the same original signal which would defeat the purpose of jamming. The bifurcation and synchronization phenomena are unique to non-linear systems and tend to be absent in traditional RF circuit designs as circuit designers typically focus on circuits that are as linear as possible.

Note that the system dynamics (and hence the readout strategy) for DC and AC signals may be significantly different. For example, for the AC signal case, the disclosed systems and methods offer an advantage of extremely rapid response (on a time-scale of nano-seconds when operating at RF frequency) as well as a wide bandwidth response, e.g., the target frequency may range from a few Hz up to the GHz band. In these aspects, the disclosed methods and systems provide a significant improvement over standard frequency-sensitive signal analyzers, which are linear and must be "tuned" to respond optimally in very narrow and restrictive signal bands.

Referring back to FIG. 3, the functionality of channelizer 130 may contribute to analyzing an RF signal in a parallel manner and to provide respective response signals for further use and processing. The results from simulations and prototype circuits have shown that exemplary channelizer circuits may have extremely fast lock-on response (within one to two cycles of the operational frequency) and that each such exemplary system may replace many analog filters and reduce the complexity and operating speed of the Analog-to-Digital converter and Digital Signal Processing chips that are currently employed in the present state-of-the-art RF systems, thereby reducing size, weight, power, and cost, while providing a significantly more efficient signal processing capability. The disclosed embodiments may be integrated into existing radios and RF communication systems, another benefit to further reduce cost. The disclosed embodiments may also have the capability to fully cover the wide spectrum of radio frequencies suitable for many communication related applications.

The non-linear channelizer approach discussed with respect to FIGS. 1-3 circumvent the traditional solution by taking advantage of the non-linear properties of a generic non-linear system, in particular, its bifurcation qualities and its ability to synchronize to an incoming signal (while synchronized, the phase and frequency dynamics of the oscillator is overwhelmingly dominated by the incoming signal). In addition to taking advantage of these dynamic qualities, non-linear tools concerning the topology of the coupling between the oscillator and the RF signal input, as well as between the oscillator and other oscillator arrays, allow for a significant increase in the utility of the non-linear channelizer. These tools, which are group-theoretic in nature, may allow the designer to virtually dictate the behaviors of the oscillators with regard to the input signal, as well as the behavior of interconnected oscillator arrays. The approach may often result in coupled oscillator systems that retain specific topological symmetries, as well as time-shift invariant symmetries. Examples that have been demonstrated include arbitrary signal frequency up-conversion and down-conversion.

In practice, the array of oscillators 302-1, 302-2 and 302-3 may be constructed to oscillate at a natural frequency. Alternatively, the array of oscillators 302-1, 302-2 and 302-3 may be made to operate in a quiescent (meta-stable state) where an appropriate input signal results in a conformal change in the operation of the circuit usually by forcing it through a heteroclinic bifurcation to oscillatory behavior.

In both cases, such an array may spontaneously synchronize to the input frequency of the input signal and adopt a phase response that is overwhelmingly driven by the input signal. For low-order systems, synchronization response times are near instantaneous (i.e., it may happen within a few cycles of the input signal), which is a fundamental physical principal behind injection locking as is known in the RF community.

Existing demonstrative circuits, as well as careful theoretical and numerical investigations, indicate that there is a potential for a radical new approach to analog signal processing in the RF realm. By accounting for both the fundamental principals (the dynamics of bi-stable systems with efficient coupling described above), as well as the specific design requirements needed to operate over specific broad frequencies, a large number of compact circuits may be implemented in a single IC leading to a technology that has the potential to enable the processing of RF signals and information in parallel on a large scale.

Figure 4:
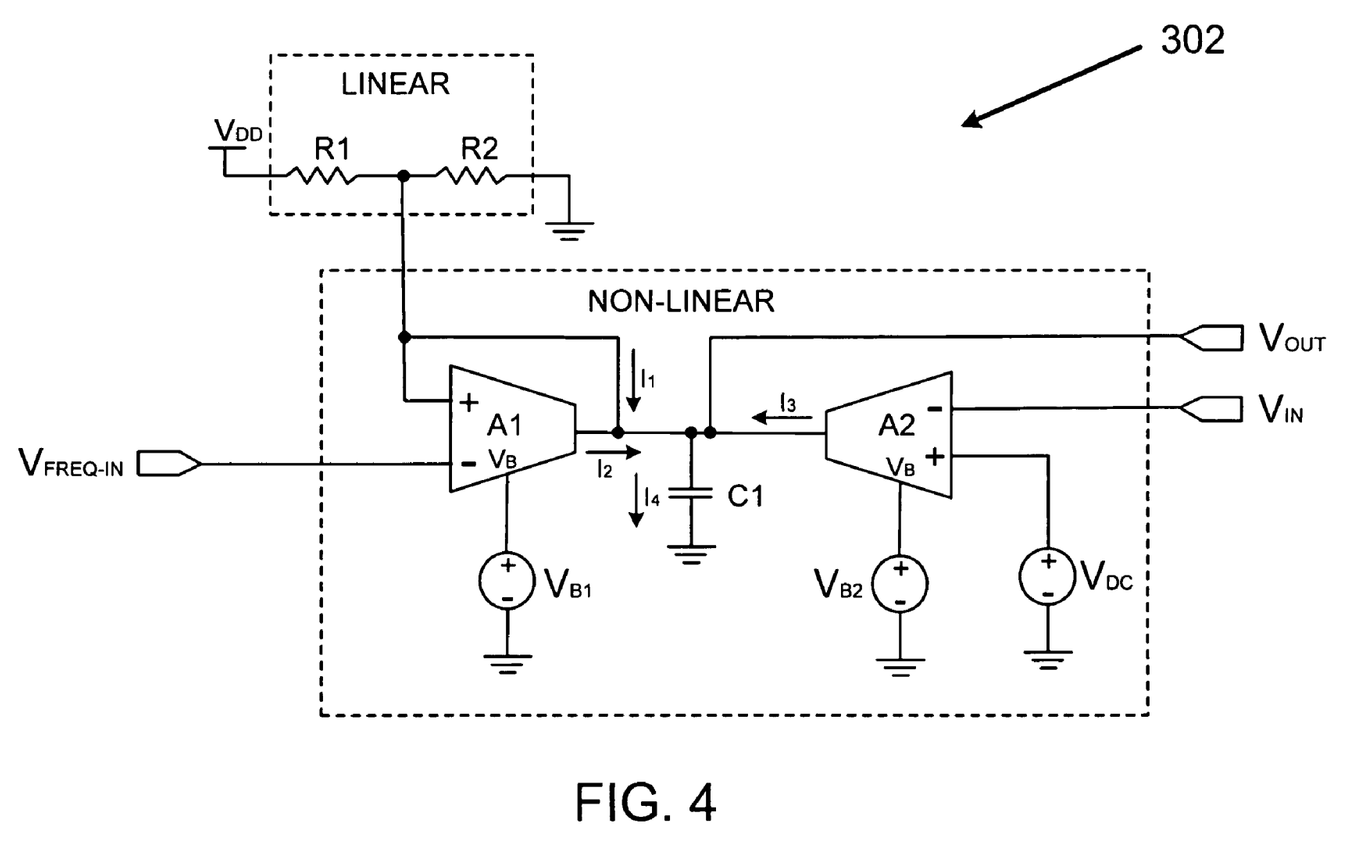
FIG. 4 shows a circuit diagram for an exemplary non-linear oscillator of the channel capture circuit of FIG. 3.

FIG. 4 shows a circuit diagram for an exemplary non-linear oscillator 302 of the channel capture circuit 210 of FIG. 3. As shown, non-linear oscillator 302 includes two operational transconductance amplifiers (OTAs) A1 and A2, resistors R1 and R2, capacitor C1, and voltage bias circuits $V_{B1}$, $V_{B2}$, and $V_{DC}$. Inside the OTAs A1 and A2 include transistor-based circuits configured as current mirrors and other devices familiar to a knowledgeable circuit designer.

In operation, voltage input node $V_{IN}$ and voltage output node $V_{OUT}$ may be used to connect N such like circuits to form an oscillating device having a ring topology, again noting that a resultant frequency down-conversion may be proportionate to N. Input node $V_{FREQ-IN}$ may be used to introduce some source signal for which oscillator 302 may be used to capture and frequency down-convert.

The basic dynamics of an N-oscillator array may take the form:

$$C_{eff}\frac{dV_i}{dt} = I_0 - I_{sc} + I_s \tanh[c_s(V_i - \varepsilon(t))] + I_c \tanh[c_c(V_{dc} - V_{i+1})] \quad \text{Eq. (1)}$$

where i=1 . . . N, j=i+1, and $V_{N+1}=V_1$. Note that there are cyclic boundary conditions; the array is actually an N-oscillator "ring" with forward coupling only. $C_{eff}$ is the effective load capacitance of the entire circuit which sets the maximum response time of the entire circuit. $I_{SC}$ ($I_1$ on FIG. 4)=$I_{R1}$−$I_{R2}$, which is the effective current from the linear portion of circuit 302, noting that $I_{R1}$ is the current resistor R1, and $I_{R2}$ is the current resistor R2. $I_S$ is a non-linear coefficient that defines the bi-stability of the circuit when tuned passed a threshold value. For a bi-stable region, $I_S$ may be tuned to a value greater than or equal to $g/c_s$. For a mono-stable region, $I_S$ may be set equal to or below $g/c_s$, and all the tuning may be done by controlling the bias voltage of OTA A1. $I_C$ is the coupling coefficient between the non-linear oscillators. It may be tuned to hold various values depending on the various behaviors demanded from the system similar to the tuning of the Is.

Note that $c_s$ and $c_c$ are to first-order, constants dependent on process parameters and temperature. Also note that $V_{dc}=V_{dd}/2$, where $V_{dd}$ is a supplied voltage used in during operation. Again, $\epsilon(t)$ represents a time dependent, externally applied signal (at node $V_{FREQ-IN}$).

Response to a Time-Dependent Input Signal

Consider the case when the input (target) signal may be represented by $\epsilon(t)$. In such a case, it is possible to plot a phase diagram 500 (FIG. 5) of the response of a channelizing system. In practice, the signal frequency may be fixed and quantify the response of individual oscillators in a ring/array as a function of the control parameters $\epsilon$ and $I_C$.

Figure 5:
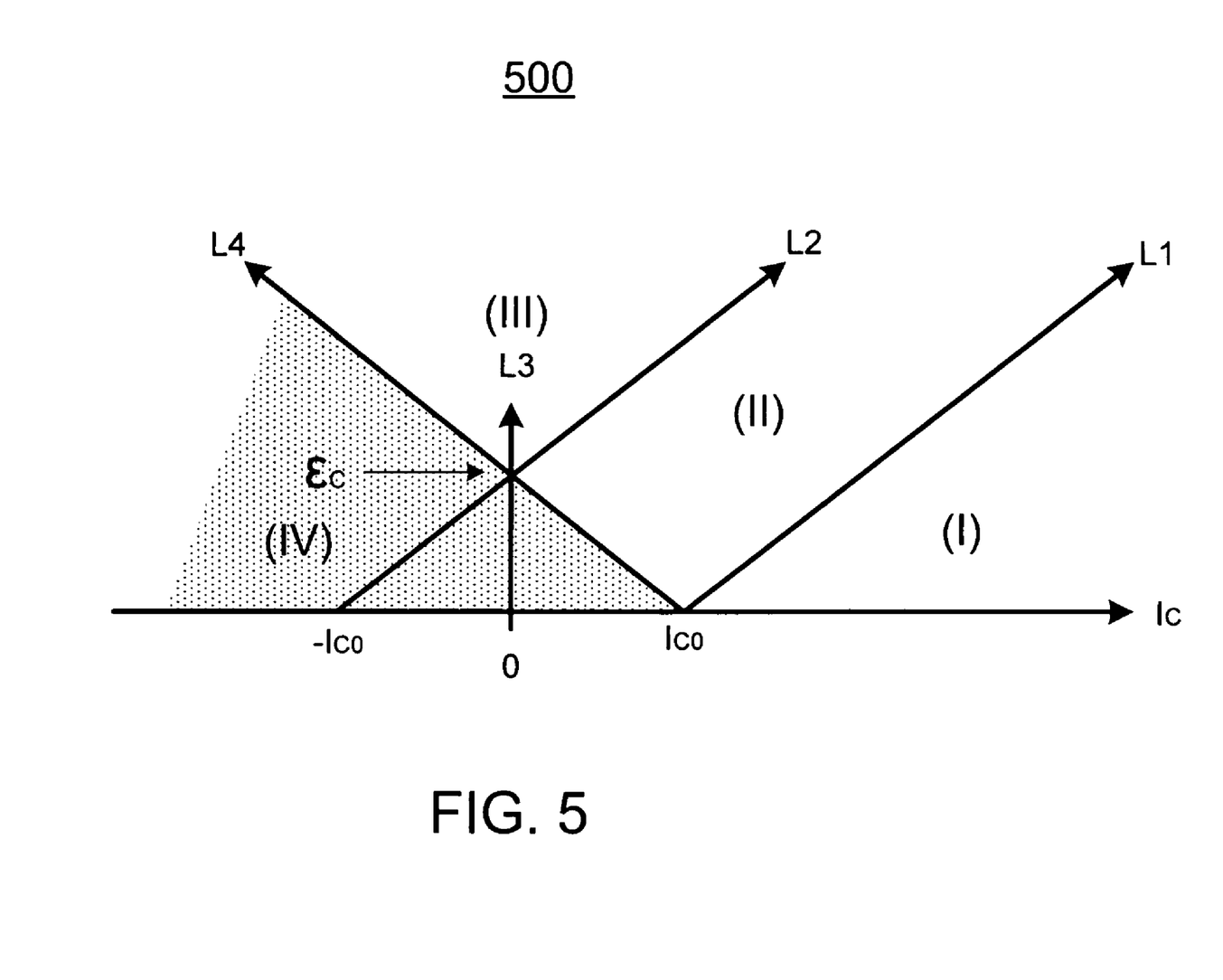
FIG. 5 shows the various functional zones for the non-linear oscillator of FIG. 4.

FIG. 5 shows that there exist regimes wherein the system responds at frequencies that are multiples (and/or a division of) of the drive frequency $\omega$. There are also regimes wherein there are no oscillations unless the parameters $\epsilon$ and $I_C$ exceed critical values (these values may be computed, theoretically).

Along the horizontal axis, the subcritical regime (region (II)) and supercritical regime (region (I)) may be defined as being to the right and left of point $I_{C0}$. This point represents the critical value of the coupling coefficients to generate oscillations in the absence of any target signal. The system behavior may be discussed in terms of the response in these two broad regimes:

The Subcritical regime (region (II)) corresponding to $I_C<I_{C0}$. For $\epsilon=0$ this regime (I) may be quiescent with the critical value $I_{C0}$ easily computed from Eq. (1). With increasing $\epsilon$, however, a regime is entered wherein the array begins to oscillate. In fact, depending on the particular values of $\epsilon$ and $I_c$, array oscillations may be obtained at frequencies $\omega/3$ (in general, $\omega/N$ for an N-oscillator array) or (for large values of $\epsilon$ and/or $I_C)\omega$. It may observed in FIG. 5 that a very broad regime exists whereby a channelizing array may respond at frequency $\omega/3$ (or $\omega/N$), noting that the regime of perfect synchronization to an external signal (frequency $\omega$) is much smaller.

The Supercritical regime (region (I)) may exist where $I_C>I_{C0}$. Here, depending on the values of $\epsilon$ and $I_C$, one may obtain either oscillations at frequency $\omega/3$ (or $\omega/N$) or (for large values of the coupling) a regime of very complex behavior wherein families of harmonics and sub-harmonics of the applied frequency are present in the array response. One may also obtain combination tones at frequencies $n\omega_0\pm m\omega$, where m and n are integers, and $\omega_0$ is the array oscillation frequency in the absence of the applied signal.

An understanding of the oscillator's response to the incoming signal may be found through numerical and analytical analysis of the model system. The significant 'regions' of response of the oscillator are illustrated in the bifurcation diagram shown in FIG. 5. The diagram 500 illustrates three regions of response to a signal of increasing amplitude, versus a parameter representing the strength of the coupling between the components of the ring. In the supercritical region (region (I)) the oscillator is not frequency locked to the incoming signal, rather it oscillates at its natural frequency.

In regions (I) and (II) the components of the oscillator switch in the out-of-phase pattern. In region (II) the oscillator is frequency locked to the incoming signal so that each component of the oscillator switches at a frequency that is $\omega/N$, where $\omega$ is the frequency of the incoming signal and N is the number of components in the oscillator.

In region (III) the dynamics of each component are overdriven by the incoming signal, resulting in an in-phase response with respect to each other and the signal.

The significance of regions (II) and (III) is that in those regions the response of the oscillator is overwhelmingly driven by the qualities of the incoming signal—its phase and frequency. In this sense the oscillator is 'channeling' the significant qualities of the incoming signal. Even in the case of frequency down-conversion, which occurs in region (II), the phase information of the input signal is preserved via the synchronization effect.

The Response of a Coupled Circuit (Channel)

Channelizing devices are ideally biased to operate in region IV (see FIG. 5), where the coupled system exhibits no oscillations prior to the advent of the input signal. An exemplary system may then start oscillating as the input signal amplitude is increased. Such a coupled system would exhibit the behavior similar to that in region II (⅓ times the input signal frequency).

Figure 6:
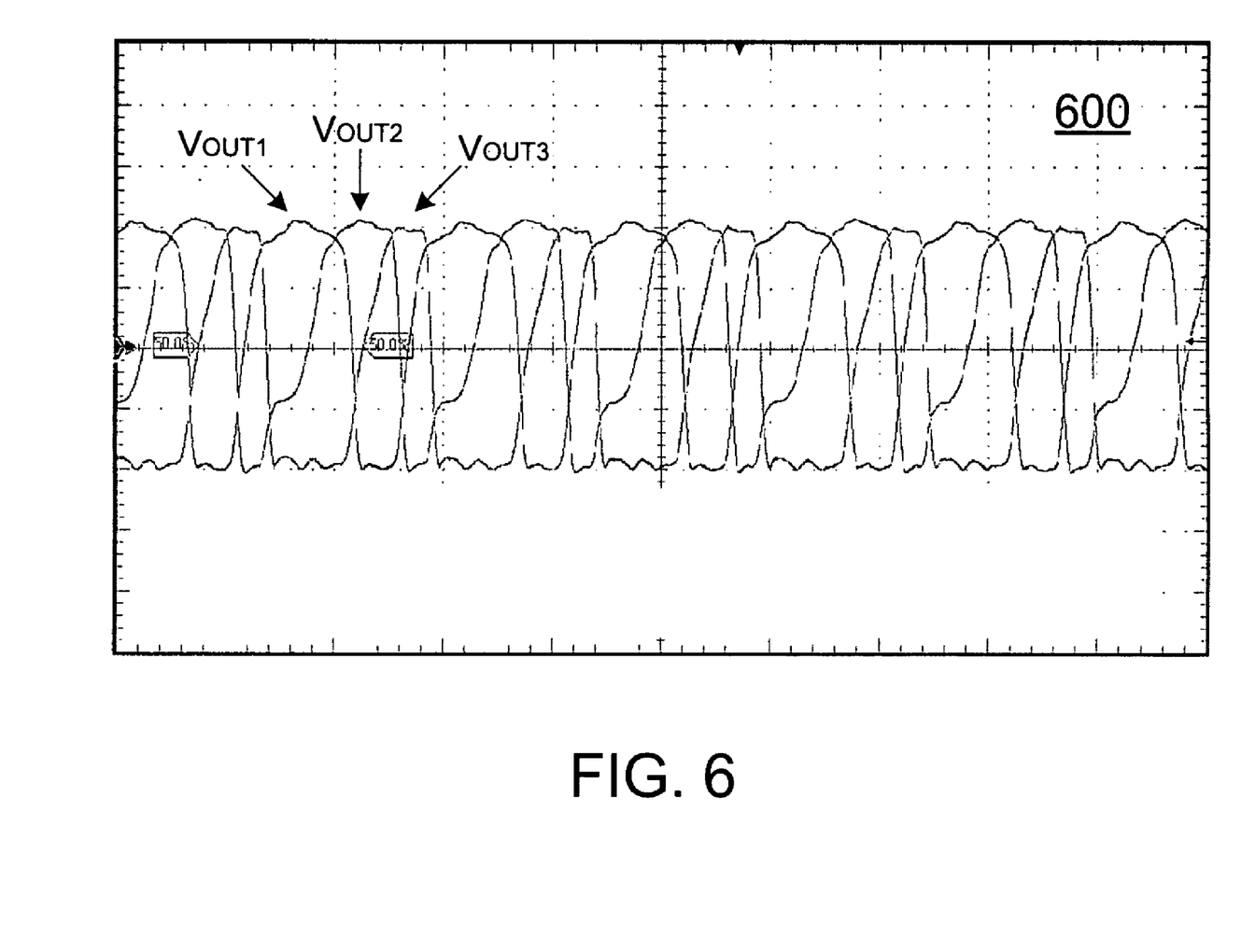
FIGS. 6 and 7 show output waveforms of realized channel capture circuits.

FIG. 6 shows the response 600 of an exemplary system to a sinusoidal input signal. The output of the exemplary coupled system is locked and oscillating at 33 MHz (⅓ of input frequency) to an input signal of 90 mV at 99 MHz. The coupling for the example of FIG. 6 was set so that it was not oscillating a priori. The bias voltage of a coupling OTA (e.g., OTA A2 of FIG. 4), $V_{B2}$, was turned to a lower value to obtain a non-oscillatory state. By design, the frequency of the oscillation decreases as the $V_{B2}$ decreases.

Figure 7:
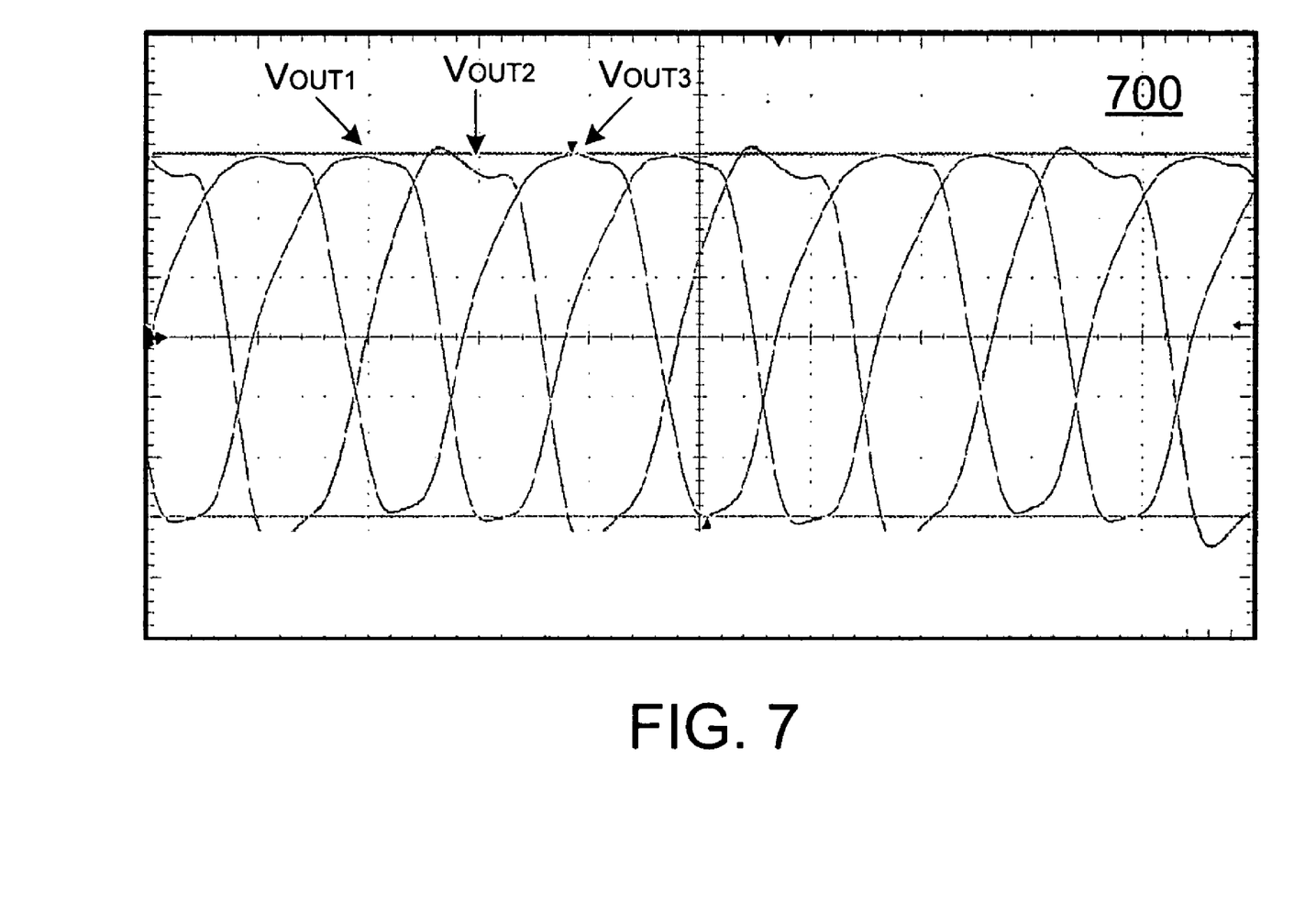

Configuring the example system to operate in region II, the coupling strength was chosen so that the example system is already oscillating with no input signal. The center frequency of the example test circuit was designed to be at 150 MHz in each non-linear oscillator. However in an actual test, this frequency was set at 88.4 MHz for ease of demonstration. FIG. 7 shows a response 700 of the exemplary coupled system locked at 88.4 MHz to an input signal of 40 mV at 265.2 MHz.

Figure 8:
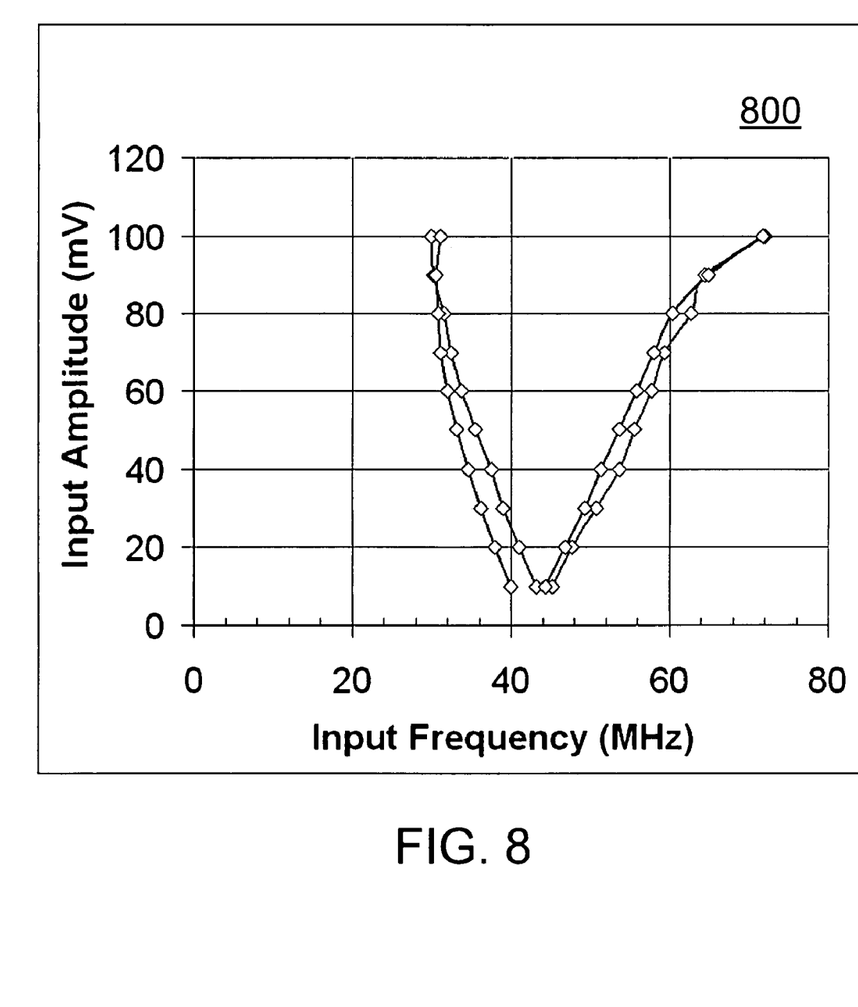
FIGS. 8-10 show exemplary frequency capture ranges of exemplary channel capture circuits.
Figure 9:
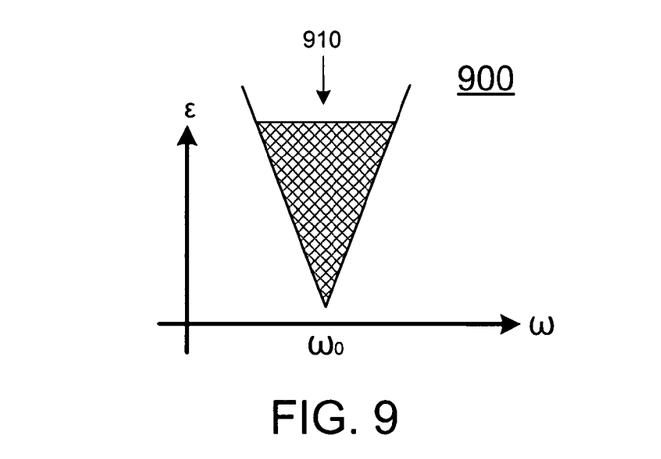

FIG. 8 shows a graph 800 illustrating a parameter space sweep of input signal amplitude vs. input signal frequency for two different test channels. Graph 800 depicts the ability to configure a channelizing system to act on channels based on the "V" shape (Arnold's Tongue). FIG. 9 is a graph 900 showing an idealized space sweep 910 centered at frequency $\omega_0$.

Figure 10:
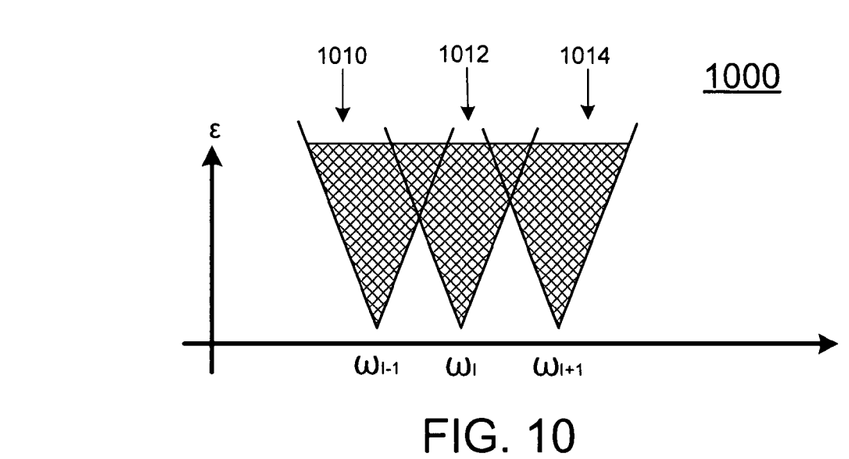

In configuring various channelizers, such "V" shapes of FIG. 9 may be stacked one next to the other to be able to prosecute input signals across a wide spectrum contained in an input signal, as is illustrated in FIG. 10, which depicts a graph 1000 showing three separate space sweeps 1010, 1012 and 1014 centered at respective frequencies $\omega_{I-1}$, $\omega_I$, and $\omega_{I+1}$.

Note that each "V" shape is a channel and would be able to take a band of frequencies as determined by a designer. Different widths of the "V" shape may be tuned by tuning the parameters of the circuits to either widen or narrowing the channel effect. Consequently, the effect of tuning various circuit parameters may create a stacking effect to build a channelizer to cover a wide spectrum.

Channelizer with Modulated Input Signals

Figure 11:
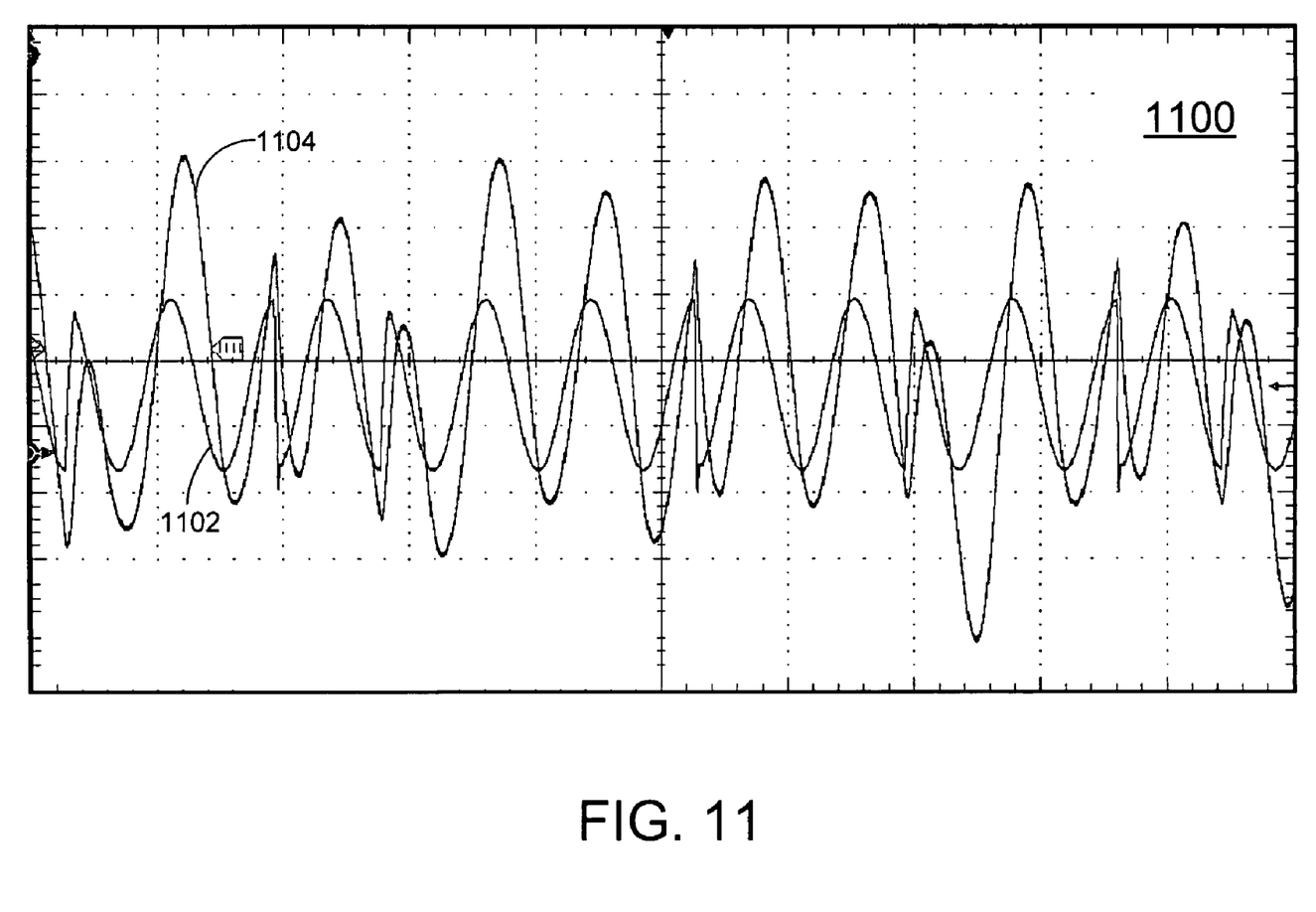
FIGS. 11-13 show various transfer functions of exemplary channel capture circuits.
Figure 12:
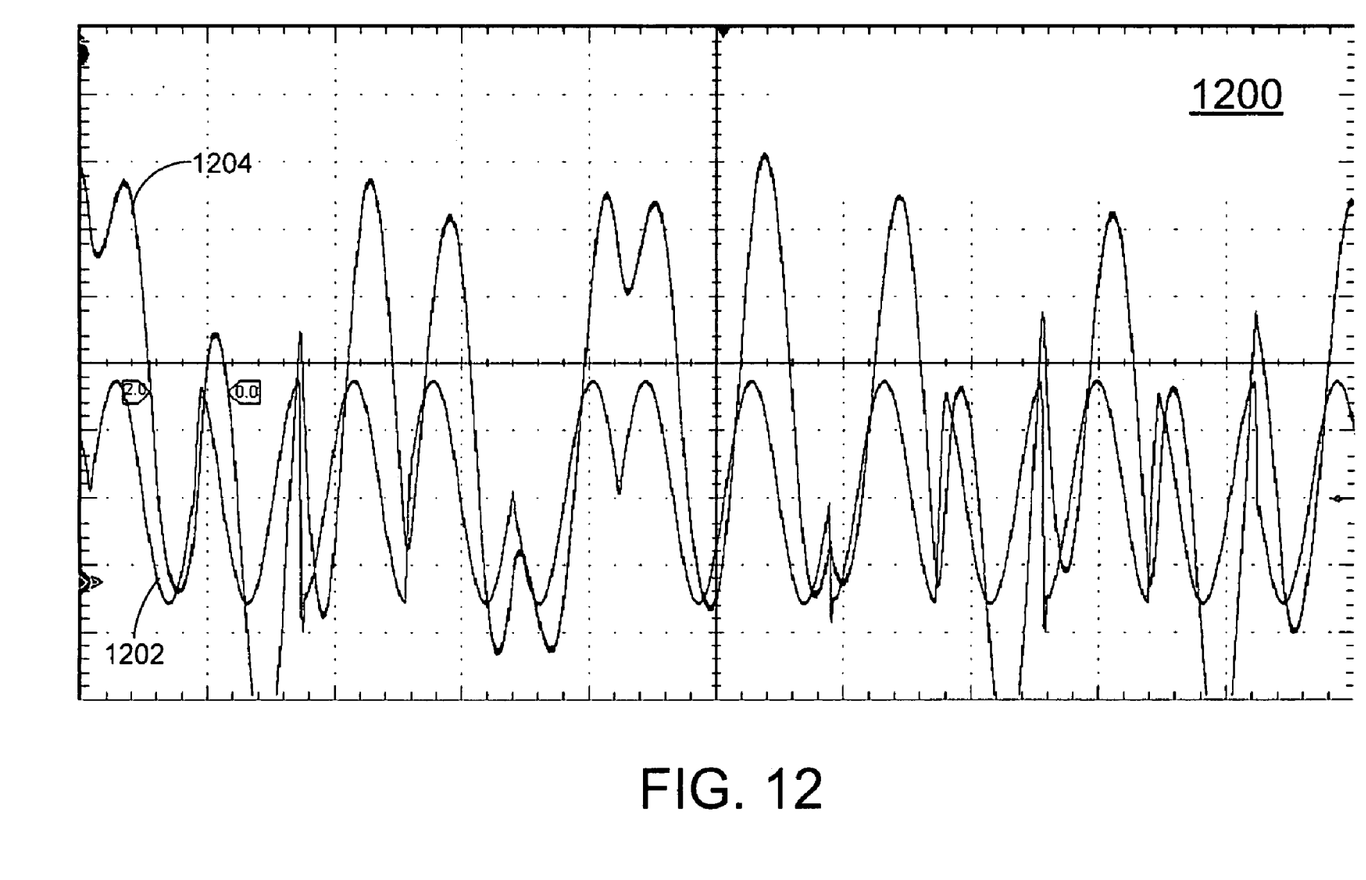
Figure 13:
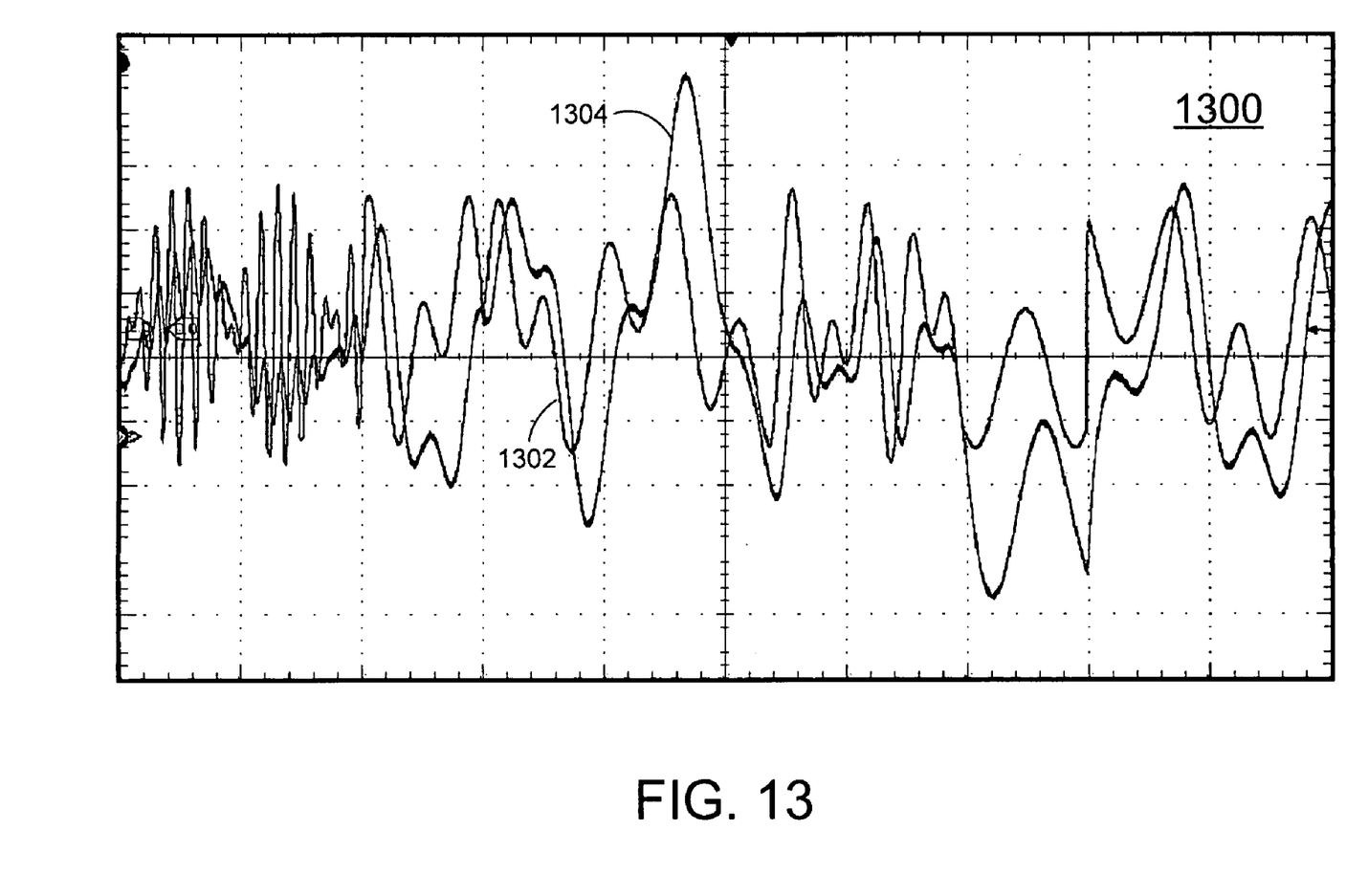

FIGS. 11-13 show how a tested channelizer circuit responds to real world signals. As predicted by simulations and other results, the exemplary tested channelizer circuit was able to lock onto an input signal with Binary-Phase Shift Keying (BPSK) as shown in FIG. 11, a Quadrature-Phase Shift Keying (QPSK) as shown in FIG. 12, and a complex modulated format used in most communication systems (similar to cell phone signals) called the Frequency Hop Spread Spectrum (FHSS) as shown in FIG. 13.

All of these real world modulation formats are quite common, and the test results illustrate that channelizer systems may lock to these modulations quite well. Thus, these results confirm the working principles of the channelizer.

As may be seen from FIG. 11, a (scaled and shifted) summed response 1104 of the tested channelizer circuit follows the BPSK input 1102 signal closely. Similarly, as seen from FIG. 12, a summed response 1204 (again scaled and shifted) follows the QPSK input 1202 signal closely. As expected, the summed responses 1104/1204 of FIGS. 11 and 12 show the same frequency as the respective input signal 1102/1202.

Continuing to FIG. 13, the input FHSS signal 1302 was constructed by modulating a random bit sequence with a carrier frequency with random hops between 4 KHz, 2 KHz, 1.33 KHz, 1 KHz, 666 Hz and 333 Hz for demonstration purposes. Note that the actual circuits are capable of oscillating in the MHz regime as indicated earlier. As may be seen from FIG. 13, the summed response 1304 tracks the FHSS input signal 1302 with considerable accuracy.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

We claim:

1. A device comprising:
    a plurality of channel-capture circuits, each channel-capture circuit comprising an array of N non-linear oscillators, wherein N≧3, circularly connected to each other in series such that unidirectional signal flow occurs between the oscillators
    wherein each channel-capture circuit is configured to capture a channel signal from a wideband signal containing a plurality of channel signals and convert its captured channel signal to a lower frequency.

2. The device of claim 1, wherein each oscillator of the array of N non-linear oscillators comprises a non-linear, bi-stable, over-damped oscillator.

3. The device of claim 1, wherein each oscillator of the array of N non-linear oscillators comprises:
    an oscillator input configured to receive an output signal from another oscillator;
    an oscillator output configured to provide an output for an input of another oscillator; and
    a frequency capture input configured to receive at least a portion of the wideband signal.

4. The device of claim 3, wherein each oscillator of the array of N non-linear oscillators further comprises:
    at least two operational transconductance amplifiers (OTAs), one OTA configured to receive the output signal from another oscillator via the oscillator input and one OTA configured to receive the portion of the wideband signal via the frequency capture input; and
    a control capacitor connected to the output of the at least two OTAs.

5. The device of claim 4, further comprising an analog-to-digital converter connected to the output of each channel-capture circuit.

6. A device comprising:
    a plurality of channel-capture circuits, each channel-capture circuit configured to capture a channel signal from a wideband signal containing a plurality of channel signals and convert its captured channel signal to a lower frequency, wherein each channel-capture circuit comprises an array of N non-linear oscillators, wherein N≧3, circularly connected to each other in series such that unidirectional signal flow occurs between the oscillators; and
    an analog-to-digital converter connected to the output of each channel-capture circuit.

7. The device of claim 6, wherein each oscillator of the array of N non-linear oscillators comprises a non-linear, bi-stable, over-damped oscillator.

8. The device of claim 6, wherein each oscillator of the array of N non-linear oscillators comprises:
    a first oscillator input configured to receive an output signal from another oscillator;
    a first oscillator output configured to provide an output for an input of another oscillator; and
    a first frequency capture input configured to receive at least a portion of the wideband signal.

9. The device of claim 8, wherein each oscillator of the array of N non-linear oscillators further comprises:
    at least two operational transconductance amplifiers (OTAs), one OTA configured to receive the output signal from another oscillator via the oscillator input and one OTA configured to receive the portion of the wideband signal via the frequency capture input; and
    a control capacitor coupled to the output of the at least two OTAs.

10. A method comprising the steps of:
    receiving a wideband signal containing a plurality of channel signals; and
    capturing and frequency down-converting each channel signal using a respective channel-capture circuit, wherein each respective channel-capture circuit comprises an array of N non-linear oscillators, wherein N≧3, circularly connected to each other in series such that unidirectional signal flow occurs between the oscillators.

11. The method of claim 10, wherein each oscillator of the array of N non-linear oscillators comprises a non-linear, bi-stable, over-damped oscillator.

12. The method of claim 10, wherein each oscillator of the array of N non-linear oscillators comprises
    an oscillator input configured to receive an output signal from another oscillator;
    an oscillator output configured to provide an output for an input of another oscillator; and
    a frequency capture input configured to receive at least a portion of the wideband signal.

13. The method of claim 12, wherein each oscillator further comprises:
    at least two transconductance amplifiers (OTAs), one OTA configured to receive the output signal from another oscillator via the oscillator input and one amplifier configured to receive the portion of the wideband signal via the frequency capture input; and
    a control capacitor connected to the output of the at least two OTAs.

14. The method of claim 10, further comprising the step of digitizing each down-converted captured channel signal using an analog-to-digital converter connected to the output of the respective channel-capture circuit.

* * * * *